US006455419B1

(12) United States Patent
Konecni et al.

(10) Patent No.: US 6,455,419 B1
(45) Date of Patent: Sep. 24, 2002

(54) SYSTEM AND METHOD OF FORMING A TUNGSTEN PLUG

(75) Inventors: Anthony J. Konecni, Plano; Srikanth Bolnedi, Dallas, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/392,274

(22) Filed: Sep. 9, 1999

Related U.S. Application Data

(62) Division of application No. 09/225,576, filed on Jan. 5, 1999, now Pat. No. 6,215,186.
(60) Provisional application No. 60/071,201, filed on Jan. 12, 1998.

(51) Int. Cl.[7] .............................................. H01L 21/44
(52) U.S. Cl. ..................... 438/653; 438/643; 438/644; 438/648; 438/654; 438/656; 438/658; 438/659; 438/792
(58) Field of Search .............................. 438/653, 654, 438/656, 658, 659, 792, 627, 643, 628, 629, 637, 644, 648, FOR 350, FOR 352, FOR 158

(56) References Cited

U.S. PATENT DOCUMENTS

| 5,049,975 A | * | 9/1991 | Ajika et al. | |
| 5,449,954 A | | 9/1995 | Ito | 257/751 |
| 5,591,672 A | * | 1/1997 | Lee et al. | |
| 5,624,870 A | | 4/1997 | Chien et al. | 438/653 |
| 5,712,193 A | * | 1/1998 | Hower et al. | |
| 5,723,362 A | * | 3/1998 | Inoue et al. | |
| 5,874,355 A | * | 2/1999 | Huang et al. | |
| 5,976,976 A | * | 11/1999 | Doan et al. | |
| 6,063,703 A | * | 5/2000 | Shinriki et al. | |
| 6,093,645 A | * | 7/2000 | Ameen et al. | |

FOREIGN PATENT DOCUMENTS

| JP | 5-326517 | * | 12/1993 |
| JP | 6-291196 | * | 10/1994 |

* cited by examiner

Primary Examiner—George Fourson
Assistant Examiner—Michelle Estrada
(74) Attorney, Agent, or Firm—Jacqueline J. Garner; W. James Brady III; Frederick J. Telecky, Jr.

(57) ABSTRACT

An electronic device is provided that compromises a dielectric layer (12) disposed outwardly from a substrate (10). The dielectric layer (12) has at least one contact opening (14) formed through the dielectric layer (12). The device has an adhesion layer (16) disposed outwardly from the exposed surfaces of the dielectric layer (12) and the substrate (10). A first barrier layer (18) is formed outwardly from the adhesion layer (16). A second barrier layer (20) is formed outwardly from the first barrier layer (18). A conductive plug (24) fills the contact opening (14) and is disposed outwardly from the second barrier layer (20).

7 Claims, 2 Drawing Sheets

SYSTEM AND METHOD OF FORMING A TUNGSTEN PLUG

CROSS REFERENCE TO PRIOR APPLICATIONS

This application is a division of application Ser. No. 09/225,576 filed Jan. 5, 1999, and claiming priority based upon Provisional Application No. 60/071,201 filed Jan. 12, 1998.

TECHNICAL FIELD OF THE INVENTION

The present invention relates to the field of electronic devices, and more particularly to a system and method of forming a tungsten plug.

BACKGROUND OF THE INVENTION

The density of microelectronic devices on a semiconductor substrate may be increased by decreasing the size or line width of the microelectronic devices. The decrease in line width allows a large number of microelectronic devices to be formed on the semiconductor substrate. As a result, the computing power and speed of the semiconductor device maybe greatly improved.

In order to decrease the line width of a microelectronic device, the lateral dimensions of conductor, semiconductor and insulator regions forming each a microelectronic device must be reduced. For example, the lateral width of structures such as vias and interconnects must be reduced in order to achieve microelectronic devices of reduced geometries. Conductive vias and interconnects are utilized within microelectronic devices to form contact openings that allow an overlying conductive layer to electrically contact an underlying conductive layer through an intermediate layer such as a dielectric layer. Such contact openings may be filled with plugs of conductive material designed to electrically connect the two conductive layers.

One commonly used conductive material in plug applications designed to fill contact openings is tungsten. The formation of tungsten plug structures requires first depositing a layer of barrier material such as titanium nitride (TiN) to avoid damaging a titanium adhesion layer typically present where the contact opening meets the substrate. An undamaged adhesion layer is essential to provide a low contact resistance between a plug and the underlying substrate. Traditionally, increasing the thickness of the barrier layer was seen as a viable means of insuring that the adhesion layer remained free of defects during plug formation. However, as the lateral dimensions of contact openings continue to decrease, the via resistance of such openings reaches a prohibitive level if a significant portion of their widths are taken up with the thickness of the barrier layer. A problem therefore arises as to how to maintain the protective characteristics of the barrier layer at the significantly reduced thicknesses demanded by ever shrinking device geometries.

SUMMARY OF THE INVENTION

Accordingly, a need has arisen for a structure and method for forming tungsten plugs in contact openings utilized in smaller device geometries that avoids defects in the adhesion layers present within those contact openings. In accordance with the teachings of the present invention, a structure and method of forming tungsten plugs is provided that avoids damage to the adhesion layers needed to provide effective conductive interconnects.

According to one embodiment of the present invention, an electronic device is provided that comprises a dielectric layer disposed outwardly from a substrate. The dielectric layer has at least one contact opening formed through the dielectric layer. The device has an adhesion layer disposed outwardly from the exposed surfaces of the dielectric layer and the substrate. A first barrier layer is formed outwardly from the adhesion layer. A second barrier layer is formed outwardly from the first barrier layer. A conductive plug fills the contact opening and is disposed outwardly from the second barrier layer.

The disclosed invention offers many technical advantages. For example, the invention enables the use of tungsten interconnects in reduced device geometries. In addition, the disclosed invention prevents electromigration problems in devices that utilize tungsten plugs to connect conductive layers. The invention also reduces via and contact resistance in such devices. A further technical advantage of the disclosed invention is that the invention allows for a minimization of metal stack height in conductive interconnects. Other technical advantages will be readily apparent to one skilled in the art from the following figures, descriptions and claims.

BRIEF DESCRIPTION OF THE DRAWINGS

A more complete understanding of the present invention and the advantages thereof may be acquired by referring to the accompanying figures in which like reference numerals indicate like features and wherein.

DETAILED DESCRIPTION OF THE INVENTION

The preferred embodiments of the present invention and its advantages are best understood by referring to FIGS. 1 through 7 of the drawings, like numerals being used for like and corresponding parts of various drawings.

Figure 1:
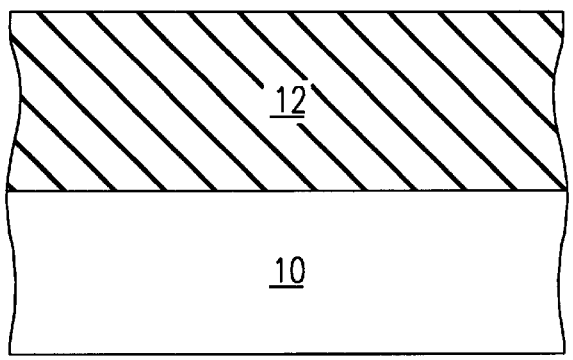
FIGS. 1 through 7 are greatly enlarged cross-sectional diagrams illustrating the method of constructing an electronic device according to the teachings of the present invention.

FIG. 1 illustrates a dielectric layer 12 overlying a substrate 10. Substrate 10 may be a wafer formed from a single crystalline silicon material. Substrate 10 may also comprise other materials. For example, substrate 10 may comprise an epitaxial material, a polycrystalline material, or other suitable material. Substrate 10 may also comprise additional layers of semiconductor material or electronic devices.

Dielectric layer 12 is grown outwardly from substrate 10. Dielectric layer 12 may be on the order of 5000 Angstroms in thickness. Dielectric layer may comprise materials having a low dielectric constant such as an oxide, xerogel, aerogel, benzol cyclobutenes, polyarylene ethers, or silsequioxanes. It should be understood that dielectric layer 12 may comprise a homogeneous layer of a single material. However, dielectric layer 12 may also comprise a heterogeneous stack of various materials. Layer 12 may, for example, include barrier layers, composed of the material such as diamond-like carbon or adhesion layers to allow the dielectric layer 12 to adhere better to materials formed inwardly from layer 12, such as substrate 10.

Figure 2:
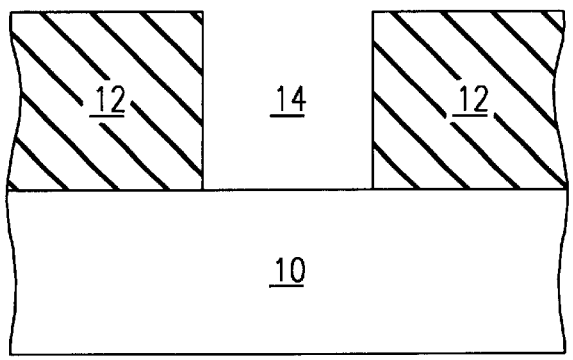

Referring to FIG. 2, conventional photolithographic processes may be used to pattern and etch contact opening 14 in dielectric layer 12. Contact opening 14 may be on the order of 3,000 Angstroms in width, for example. Ultimately, a conductive via may be formed within contact opening 14.

The conductive via within contact opening 14 is surrounded by the dielectric material within dielectric layer 12. As such, dielectric layer 12, if comprised of materials that exhibit lower dielectric constants, can prevent the formation of parasitic electronic devices between a conductive via formed in contact opening 14 and other conductive regions of the device.

Figure 3:
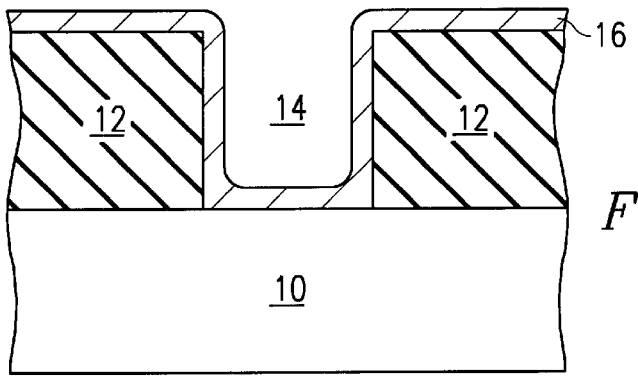

As shown in FIG. 3, an adhesion layer 16 is disposed outwardly from substrate 10 and dielectric layer 12. Adhesion layer 16 is conformally deposited within contact opening 14 and over dielectric layer 12. Adhesion layer 16 comprises, for example, titanium. Adhesion layer 16 is deposited through a physical vapor deposition (PVD) process. Adhesion layer 16 may have a thickness of 600 Angstroms, for example. Alternatively, adhesion layer may be deposited at a thickness of 200–1000 Angstroms.

Adhesion layer 16 reduces any native oxide formation present along the surface of substrate 10 within contact opening 14. The deposition of adhesion layer 16 also reduces contaminants found at the bottom of contact opening 14. Adhesion layer 16 also decreases the contact resistance along the interface of contact opening 14 and substrate 10. The resulting substrate/titanium adhesion/conductor stack is operable to create a much lower contact resistance than a substrate/conductor interface could achieve in contact opening 14.

Adhesion layer 16 is highly vulnerable to the tungsten etch back process discussed below. Damage to adhesion layer 16 may be caused by the tungsten etch back punching through a TiN barrier layer and revealing the titanium of adhesion layer 16 underneath. Once exposed, fissures and pits may form within the titanium material, possibly leading to the formation of slivers of conductive material and unwanted electrical shorts that interfere with device performance. Damage to adhesion layer 16 can also take the form of electromigration problems caused during the subsequent deposition of conductive material deposited following the formation of the tungsten plug discussed below. These electromigration problems may lead to a reduced current carrying capacity of the electronic device, as subsequently formed interconnects may not have a clearly defined conductive path to substrate 10. Punchthrough into the titanium of adhesion layer 16 may also lead to the formation of titanium fluoride compounds that further inhibit device performance.

Figure 4:
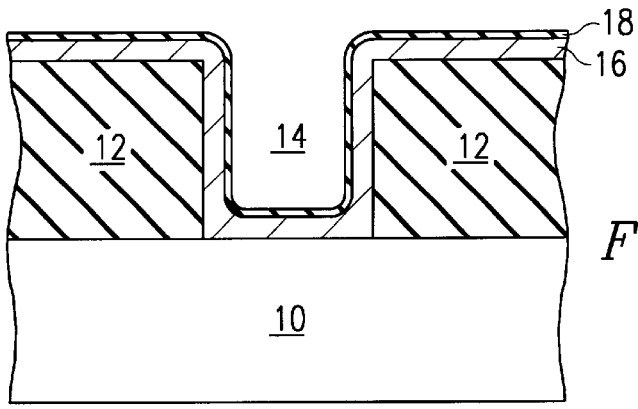

FIG. 4 illustrates the formation of a first barrier layer 18 as a first step in shielding the adhesion layer from the damage discussed above. First barrier layer 18 comprises TiN formed by a nitrogen plasma treatment. During the nitrogen plasma treatment, reactive nitrogen ions react with the titanium of adhesion layer 16, producing the TiN of the first barrier layer 18 outwardly from the surface of adhesion layer 16.

First barrier layer 18 may be on the order of 76 Angstroms in thickness. Alternatively, first barrier layer may be 50–150 Angstroms in thickness. During the creation of a first barrier layer of 76 Angstroms in thickness, for example, adhesion layer 16 may be reduced in thickness from 600 Angstroms to approximately 550 Angstroms. Nitridation plasma process results in slightly less nitridation on the floor and sides of contact opening 14 than the nitridation taking place outside contact opening 14 overlying dielectric layer 12. Thus, first barrier layer 18 is generally thinner inside contact opening 14.

The nitrogen plasma process used to form first barrier layer 18 is conducted, for example, in an evacuative chamber at a pressure of 1.0 mTorr and a temperature of 450° C. The process may utilize a flow rate of 300 standard cubic centimeters (sccm) $N_2$. The plasma process may be conducted at a power of 750 watts, for example. The plasma treatment has a duration of approximately 20 seconds, for example. Alternatively, plasma treatment process is conducted at a pressure of 0.5–2.0 mTorr and a temperature of 400–460° C. Flow rates can include 0–1,000 sccm $N_2$, 0–1,000 sccm $H_2$, 0–1,000 sccm $NH_3$ and 0–200 sccm Ar. The plasma process may also be conducted at a power range of 150–750 watts over a duration of 5–60 seconds.

Figure 5:
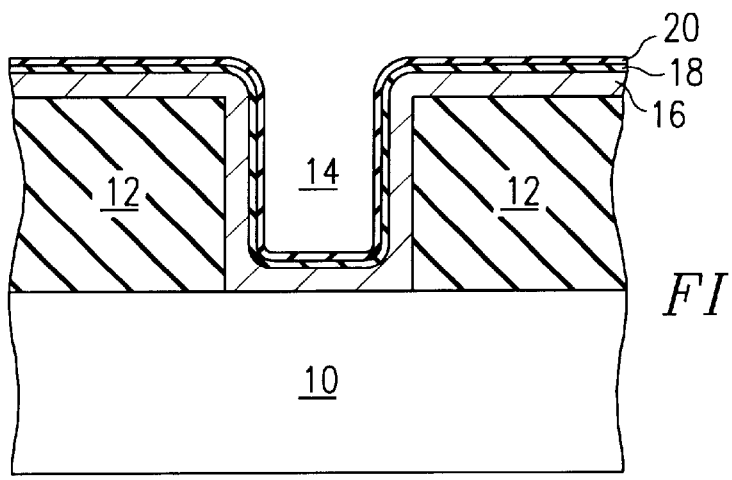

Following the formation of first barrier layer 18, a second barrier layer 20 comprising TiN is conformally deposited in FIG. 5 outwardly from first barrier layer 18 to complete the shielding of adhesion layer 16. Second barrier layer 20 thereby forms an additional coating on the floor and walls of contact opening 14. Second barrier layer 20 is deposited through an enhanced chemical vapor deposition plasma process (ECVD). ECVD process consists of a precursor deposition process followed by a plasma treatment.

Precursor deposition of second barrier layer 20 may be conducted utilizing a chemical vapor deposition (CVD) process in an evacuative chamber at a temperature of 450° C. and a pressure of 1.2 mTorr, for example. The deposition process utilizes a constant gas flow through the evacuative chamber of 70 sccm He carrier gas, 10 sccm $N_2$, and 200 sccm Ar. The He carrier gas is bubbled through an ampule in order to deliver the CVD TiN precursor, TDMAT (tetrakis dimethyl amino titanium), to the deposition chamber. This delivery process is well known in the industry. The deposition process is conducted for approximately 8 seconds. Alternatively, the deposition process forming first barrier layer 18 may be conducted in a evacuative chamber at pressures of 0.5–2.0 mTorr and at a temperature of 400–460° C. The process may utilize flow rates of 30–100 sccm He carrier gas, 0–500 sccm $H_2$ and 0–1,000 sccm Ar. Processing time may last between 5 and 20 seconds depending upon the above flow rates and temperature. It will be understood that second barrier layer 20 may be deposited by a traditional PVD or CVD process.

Up to 200 Angstroms of TiN, for example, may be deposited in the manner described by the above process to form second barrier layer 20. The thickness of second barrier layer 20 may also vary between 50 to 500 Angstroms in thickness. Alternatively, carbon containing tinitride (TiNC) may be deposited in a similar manner. Following the CVD TiN deposition, an anisotropic plasma treatment of the TiN is utilized that results in the densification of second barrier layer 20 and the removal of volatile and unwanted contamination such as carbon compounds. Densification during plasma process may leave a TiN thickness of approximately 100 Angstroms if 200 Angstroms of TiN were originally deposited, for example. The plasma treatment, being anisotropic, results in enhanced interaction along horizontal surfaces and therefore less densification of TiN on the walls of contact opening 14. Thus, the anisotropic plasma treatment leaves second barrier layer 20 with a thickness of approximately 100 Angstroms on horizontal surfaces and a slightly greater thickness on vertical sides of contact opening 14.

The anisotropic plasma treatment utilized in the ECVD TiN deposition process is conducted, for example, at a pressure of 1.0 mTorr and a temperature of 450° C. The treatment utilizes flow rates of 300 sccm $N_2$ and 450 sccm $H_2$. The plasma treatment may be conducted at a power of 750 watts, for example, and has a duration of approximately 20 seconds, for example. Alternatively, plasma treatment process is conducted at a pressure of 0.5–2.0 mTorr and at a temperature of 400–460° C. Flow rates can include 0–1,000 sccm $N_2$, 0–1,000 sccm $H_2$, 0–1,000 sccm $NH_3$ and 0–200 sccm Ar. The plasma process may be conducted at a power range of 150–750 watts over a duration of 5–60 seconds.

TiN may also be deposited by inorganic based CVD chemistries such as $TiCl_4$ based TiN or other organic based chemistries such as TDEAT based chemistries. Such chemistries are well known in the art. Post plasma treatment may or may not be used depending on the necessary barrier requirements.

Figure 6:
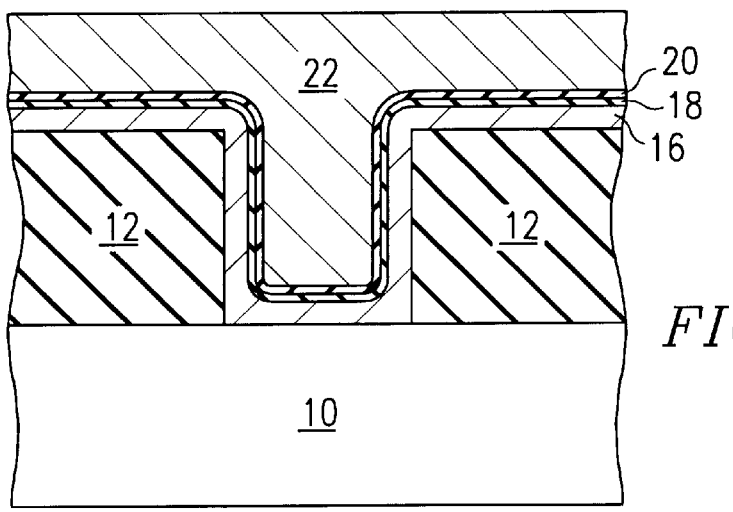

Following the completion of the formation of second barrier layer 20, a conductive layer 22, comprising tungsten, is conformally deposited in FIG. 6 outwardly from the exposed surface of second barrier layer 20. Conductive layer 22 is deposited so that contact opening 14 is completely filled with conductive material. Conductive layer 22 may be deposited by a PVD or CVD process.

Figure 7:
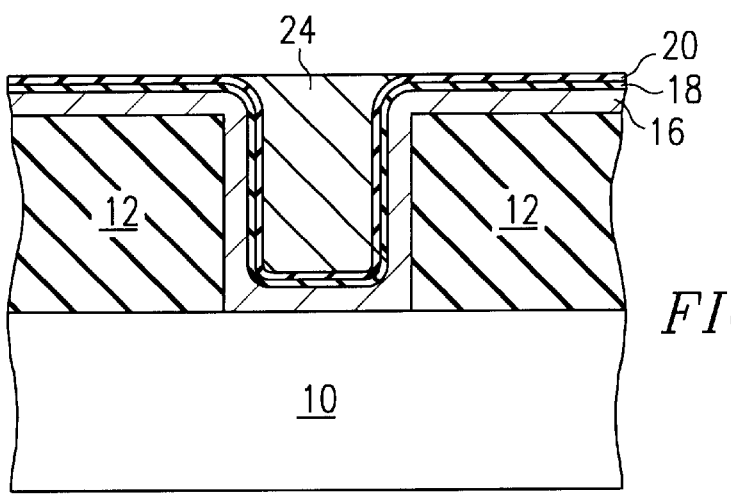

Following the formation of conductive layer 22, an etch process is utilized to complete the formation of a conductive plug 24 from conductive layer 22, as shown in FIG. 7. The etch process utilized removes the portion of conductive layer 22 disposed outwardly from the surface of contact opening 14.

The tungsten etch process is a dry plasma etch, for example, conducted in an evacuative chamber. The tungsten etch process utilizes a solution of sulfur hexafluorine ($SF_6$) and argon (Ar) to comprise a relative inert gaseous mixture. The etchant particles created from this etch chemistry during the glow discharge utilized in the plasma etch may include $SF_5+$ and $F-$, for example. Other gaseous mixtures may be utilized during the plasma etching which will react chemically with the tungsten material being etched. Variations of chemical flow rates, temperatures, and chamber pressures used during such a plasma process are generally known in the art and are contemplated by the present invention.

During the plasma etch process, highly charged etchant particles will bombard the outer surface of conductive layer 22. The above-mentioned plasma chemistry utilized to etch tungsten is also highly reactive with titanium. The introduction of first barrier layer 18 and second barrier layer 20 as a barrier layer acts to shield the titanium of adhesion layer 16 from the tungsten etch process. The above-mentioned plasma chemistry is a plasma chemistry designed to "stop" on TiN. As such, the plasma process conducted to remove tungsten is highly selective to an etch of tungsten relative to an etch of TiN. In this manner, reactive etchant particles are prevented from penetrating adhesion layer 16. If the particles were allowed to penetrate adhesion layer 16, damage to adhesion layer 16 may result as discussed previously.

Problems arise during tungsten etchback in conventional processes because the tungsten of conductive layer 22 requires an overetch after substantially all of the tungsten material located outwardly from the surface of the contact opening 14 is removed. Overetch is necessary to remove "stringers" or "slivers" which may have formed slightly inward into the barrier layer. As this overetch is conducted, any nonuniformities in the thickness of TiN overlying contact opening 16, may lead to the etch process punching through the TiN material into the underlying titanium of adhesion layer 16. Any punch through into the titanium material may again result in electromigration problems.

As already mentioned, traditional efforts to combat punchthrough during etch and overetch have taken the form of depositing increasing thicknesses of TiN. However, the densification of second barrier layer 20, coupled with first barrier layer 18 formed via the nitridation of the titanium which comprises adhesion layer 16, results in a TiN barrier structure which is highly resistant to interaction with the reactive particles utilized during the tungsten etch. Specifically, the nitridation of the titanium of adhesion layer 16 to form first barrier layer 18 may result in a TiN barrier formation that is more densely packed than a typical PVD or CVD deposited nitride making punchthrough more difficult. Similarly, second barrier layer 20, although first deposited with a tradition CVD process, is further treated with the plasma process described above to form an additional high density barrier layer of TiN. Thus, the combination of these two high density TiN layers combine to provide a barrier to the tungsten etch process that is consistent with a significantly thicker layer of traditionally deposited TiN.

By ensuring the integrity of adhesion layer 16 with a greatly reduced thickness of the barrier TiN layer, the formation of tungsten plug interconnects can be achieved in increasingly small device geometries. Smaller geometry conductive vias can utilize tungsten plugs without the risk of creating defects in the titanium of adhesion layer 16. Reducing the thickness of TiN found on the walls of contact opening 14 can also result in a greater cross-sectional area of tungsten material in contact opening 14, thereby lowering the via resistance. This greater cross-sectional area will also result in a larger contact surface between the plug formed from conductive layer 22 and substrate 10, thereby reducing the contact resistance of the interface.

Although the device and method of the present invention has been described with reference to the formation of a tungsten plug used within a conductive via to form an interconnect, it should be understood that the use of layers of TiN formed in accordance with the present invention may be equally applicable in other devices or structures. In addition to wide spread application in via applications, any device or structure involving the formation of layers of TiN may utilize the disclosed methodology to substantially reduce the thickness of the TiN, and still achieve the isolative properties of much thicker layers of TiN.

Although the present invention has been described in detail, it should be understood that various changes, alterations, substitutions, and modifications to the descriptions contained herein may be made without departing from the scope and spirit of the present invention which is solely defined by the appended claims.

Although the present invention has been described with several embodiments, various changes and modifications may be suggested to one skilled in the art. It is intended that the present invention encompass such changes and modifications as fall within the scope of the present appended claims.

What is claimed is:

1. A method of forming an electronic device comprising the steps of:

forming a dielectric layer outwardly from a substrate;

forming a contact opening in the dielectric layer;

depositing an adhesion layer outwardly from the contact opening and the dielectric layer;

treating the adhesion layer with a plasma process to form a first barrier layer;

depositing TiN material outwardly from the first barrier layer;

treating the TiN material with a plasma process to form a second barrier layer; and forming a conductive plug outwardly from the second barrier layer within the contact opening.

2. The method of claim 1, wherein the step of depositing an adhesion layer further comprises depositing a titanium layer with a physical vapor deposition process.

3. The method of claim 1, wherein the step of treating the adhesion layer further comprises treating the adhesion layer to form a TiN barrier layer.

4. The method of claim 1, wherein the step of depositing the TiN material further comprises depositing CVD TiN.

5. The method of claim 1, wherein the step of treating the TiN material further comprises densifying the TiN material.

6. A method of forming an electronic device comprising the steps of:

forming a dielectric layer outwardly from the surface of a substrate;

forming a contact opening in the dielectric layer;

depositing an adhesion layer of titanium outwardly from the contact opening and the dielectric layer;

using a plasma process to nitridize the adhesion layer, thereby forming a first barrier layer of TiN;

depositing TiN material outwardly from the first barrier layer, the TiN material being deposited by a chemical vapor deposition process;

treating the deposited TiN material with a plasma process operable to densify the TiN material;

conformally depositing a conductive layer of tungsten outwardly from the second barrier layer, the conductive layer filling the contact opening; and etching back the conductive layer disposed outwardly from the surface of the contact opening to form a conductive plug.

7. The method of claim 6, wherein the step of etching back the conductive layer further comprises performing an overetch of the conductive layer to remove any tungsten residue, the first barrier layer and the second barrier layer shielding the adhesion layer during the overetch.

* * * * *